United States Patent [19]

Fields, III

[11] Patent Number: 4,937,519

[45] Date of Patent: Jun. 26, 1990

[54] APPARATUS AND METHOD FOR IDENTIFYING CONDUCTORS

[75] Inventor: John B. Fields, III, Austin, Tex.

[73] Assignee: Jupiter Toy Company

[21] Appl. No.: 232,870

[22] Filed: Aug. 16, 1988

[51] Int. Cl.⁵ .......................... G01R 31/02; H02G 1/06
[52] U.S. Cl. ...................................... 324/66; 324/540; 324/532
[58] Field of Search .................. 379/25; 324/523, 527, 324/539, 66

[56] References Cited

U.S. PATENT DOCUMENTS

| | | |
|---|---|---|
| 3,644,687 | 2/1972 | Richards, Jr. . |
| 3,681,686 | 8/1972 | Connally . |
| 3,742,350 | 6/1973 | White . |
| 3,976,939 | 8/1976 | Cruce et al. . |
| 4,041,383 | 8/1977 | Howard . |
| 4,114,091 | 9/1978 | Howard . |
| 4,445,086 | 4/1984 | Bulatao . |
| 4,578,636 | 3/1986 | Bakke . |
| 4,652,813 | 3/1987 | Bakke . |

FOREIGN PATENT DOCUMENTS

| | | | |
|---|---|---|---|
| 0066366 | 4/1982 | Japan .................................. | 324/66 |
| 0155372 | 9/1983 | Japan .................................. | 324/66 |
| 01553719 | 9/1983 | Japan .................................. | 324/66 |
| 2055213 | 2/1981 | United Kingdom .................. | 324/66 |
| 2155188 | 9/1985 | United Kingdom .................. | 324/66 |

Primary Examiner—Reinhard J. Eisenzopf
Assistant Examiner—Jose M. Solis
Attorney, Agent, or Firm—Arnold, White & Durkee

[57] ABSTRACT

An apparatus and method for identifying individual conductors in a multi-conductor cable, which will also identify a short or open circuit condition. One end of the multi-conductor cable is connected to a battery powered transmitter unit which sequentially generates a unique pulse on each conductor. That is, the transmitter generates a pulse on a first conductor having a unique pulse width and after a small delay follows the pulse on the first conductor with a pulse on a second conductor having a unique pulse width, preferably twice the pulse width. The transmitter sequentially steps through each conductor in a cable to generate the unique pulses. The battery powered receiver unit is connected to the other end of the multi-conductor cable with a test probe and a reference probe connected to any two conductors. The receiver determines the pulse width of the pulse on the test probe and because the pulse width is unique to a particular conductor, identifies the conductor and visually displays the conductor identification to the operator. The reference probe acts as a ground during the time period that a pulse is present at the test probe. Advantageously, the apparatus can also determine if two or more of the conductors are shorted or if an open circuit exists.

21 Claims, 2 Drawing Sheets

FIG.2

APPARATUS AND METHOD FOR IDENTIFYING CONDUCTORS

BACKGROUND OF THE INVENTION

1. Field of the Invention

This invention relates to an apparatus and method for identifying individual conductors in a multi-conductor cable.

2. Description of the Related Art

It is important to be able to identify a particular conductor in a group of conductors in a wide variety of contexts. For example, in installing a computer network a multi-conductor cable having as many as fifty conductors might be strung among a number of different locations. In such a system, it is necessary to identify each individual conductor at each location so that the computer can be connected to the cable conductors in the proper manner. Other common examples exist such as: the wiring in a complex machine, such as a ship or an airplane, where a large number of conductors for a wide variety of purposes are strung together in a conductor bundle; the wiring in commercial buildings or factories where a large number of conductors might be disposed in a buss box with individual conductors branching from the buss box to remote locations; and a relatively short wiring harness having a large number of conductors.

While the need for identifying individual conductors in a group of conductors or cable is readily appreciated, known methods for such identification are deficient in many respects. Perhaps the most common method of identifying individual conductors is simply to place a worker at each end of the group of conductors or cable with some form of communication, such as a walkie-talkie or telephone. While earth ground or machine frame can sometimes be used as a reference conductor between the two ends of the cable, it is often necessary to provide a separate ground or reference strung between the two workers to provide a common reference. In the identification procedure, one worker initiates a signal on a particular conductor and the other worker hunts through the bundle of conductors to find the signal. If a short or open circuit condition is not encountered, the conductor with the signal is eventually found, the conductor tagged and segregated, and the process repeated until all of the conductors are identified. This process is tedious, and also tends to become very chaotic when a short circuit or open circuit condition is inadvertently encountered. This process also requires that a reliable reference conductor be somehow provided between the two workers.

Several attempts have been made at providing devices which can assist a worker in identifying a particular conductor. For example, U.S. Pat. No. 4,445,086 uses a transmitter and receiver unit grounded to the hull of a ship and connected to the ends of a conductor bundle. However, in this approach an identical signal is applied to each conductor and depends upon operator skill in recognizing illumination of a diode connected to each conductor. U.S. Pat. No. 3,742,350 is slightly more advantageous in that it identifies each individual conductor in a conductor bundle. However, this approach uses a unique binary code transmitted down each conductor. Applying a distinct binary code is a cumbersome process and this process also must rely upon an external conductor or ground.

SUMMARY OF THE INVENTION

The apparatus and method of the present invention generally solve the problems outlined above by arbitrarily using one of the conductors in a multi-conductor group or cable as a reference and identifying the remaining individual conductors. If a short or open circuit exists, this condition is easily identified with the apparatus hereof. Advantageously, the apparatus can be operated with only one worker and can identify the conductors quickly and accurately.

Broadly speaking, the apparatus of the present invention includes a transmitter which is coupled to one end of a group of conductors, and a receiver which is coupled to the other end of the group of conductors. The transmitter includes a power supply, an adapter having a plurality of connectors for coupling to the respective conductors, and a pulse generator. The pulse generator is operable for sequentially generating a pulse having a unique pulse width on each conductor. The receiver includes a test probe and a reference probe which are coupled to any two conductors. An input and detector circuit is coupled to the probes for identifying the pulse received by the test probe by determining the pulse width of the pulse, and using the reference probe and corresponding conductor as a reference conductor during the transmission of the pulse received by the test pulse. An indicator is provided to visually display or otherwise indicate the identification of the pulse width received by the test probe.

Preferably, the detector circuit of the receiver is operable for identifying a short circuit condition between two or more of the conductors. In the preferred embodiment, the detector circuit is also operable for identifying an open circuit condition on one or more of the conductors in the group of conductors. As used herein "group" means any two or more conductors to be identified and is sometimes referred to simply as a "cable."

The method of the present invention broadly includes the steps of transmitting a unique pulse on each conductor at one end to a group of conductors, and receiving the pulses at the other end of the group. The transmitted pulses are differentiated by their respective pulse widths to differentiate the conductors. The method further includes determining the pulse width of a transmitted pulse on at least one conductor and identifying the one conductor based on the received pulse width. Preferably, the determining step includes using another conductor in the group as a reference between the transmitting and receiving ends while analyzing the pulse width on the one conductor. The transmitting step preferably includes sequentially transmitting the pulses on respective conductors at different times. Preferably, the method includes determining if a short or open circuit condition exists in any of the conductors.

DETAILED DESCRIPTION OF THE PREFERRED EMBODIMENTS

Figure 1:
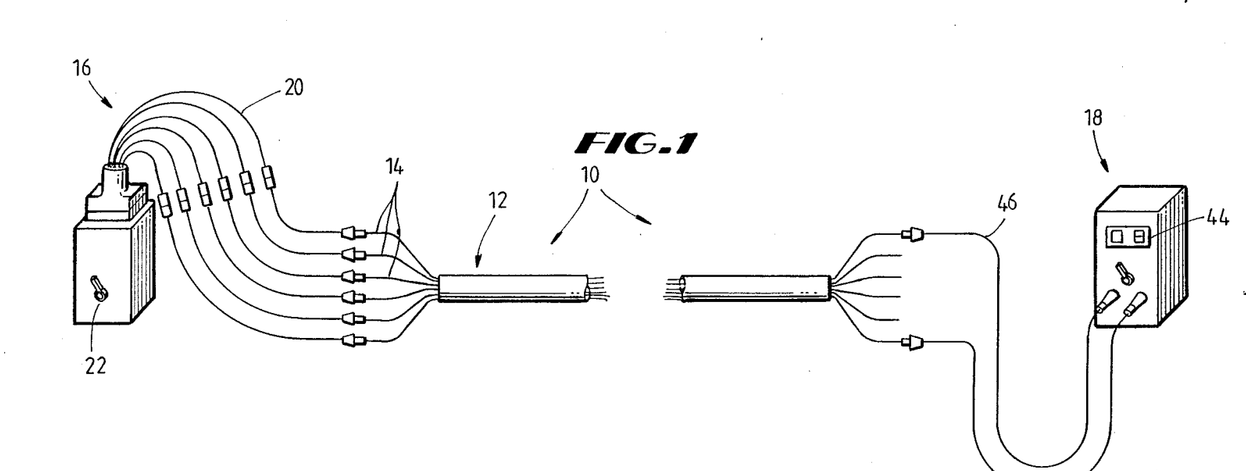
FIG. 1 is a perspective view of the identification apparatus of the present invention shown coupled to a group of conductors.

As shown in the drawing, the conductor identification apparatus 10 of the present invention is useful in identifying conductors from a group of conductors or cable 12. AS shown in FIG. 1, the group of conductors 12 may comprise a multi-conductor cable bundled as shown or, an unbundled group of conductors in, for example, a buss box or wiring harness or the like. The apparatus 10 is most useful where the group of conductors 12 is more than several feet in length as in a commercial building, but is also useful in identifying conductors in a relatively short length wiring harness. In FIG. 1, six conductors 14 are illustrated as comprising the group 12, while in FIG. 2 sixteen conductors 14 are depicted, it being understood that the number of conductors 14 in the group 12 is practically unlimited. Further with a conductor bundle having a large number of conductors, identification can be made of a "group" of conductors less than the total number.

Generally speaking, the apparatus 10 comprises a transmitting unit 16 which is coupled at one end of the cable 12 to each of the conductors 14 in the group to be identified. A receiving unit 18 is connected to the other end of the cable 12, but need not be coupled to each of the conductors 14.

Figure 2:
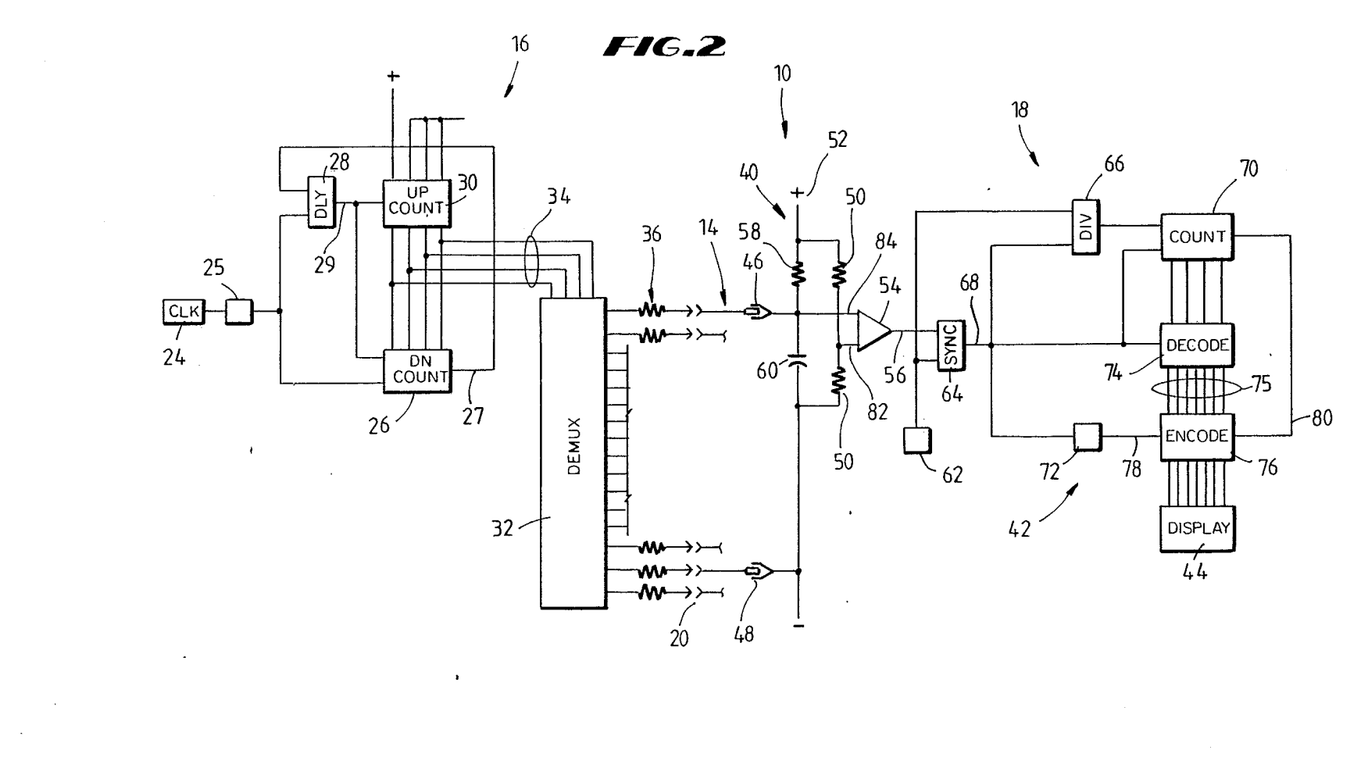
FIG. 2 is an electrical schematic of FIG. 1.

Turning to FIGS. 1 and 2, the transmitting and receiving units 16, 18 are illustrated in more detail. Broadly speaking, the transmitting unit 16 includes an adapter section 20 for connection to the cable 12, with the preferred embodiment using alligator-type clips as shown in FIG. 1. Of course, if the cable 12 terminates in a pin connector a mating adapter 20 is used. An on/off switch 22 controls the supply of battery power (6 volt) in the transmitting unit 16. A clock oscillator 24 (FIG. 2) (operating at 32, 768 Hz) generates a series of pulses of constant period as clock inputs to the divider 25. The divider 25 divides the clock signal (by 32) and sends the resultant signal as clock inputs to down counter 26 and delay element 28. The clock 24 operates at 32,768 Hz which is divided in the preferred embodiment by 32 to give a pulse width from divider 25 of approximately 1 millisecond.

The Q signal 29 is the clock input to up counter 30 and the asynchronous load input of down counter 26. Up counter 30 is connected to the broadside load inputs of down counter 26 as shown in FIG. 2, and also via leads 34 to the binary select inputs of demultiplexer 32. As shown in FIG. 2, the demultiplexer 32 has sixteen outputs, it being understood that the number of outputs can be increased as desired with the appropriate addition of up counters, down counters and multiplexers. Counter output 27 connects down counter 26 and delay element 28.

The receiver 18 broadly includes an input section 40, a detector circuit 42, and a display 44. The input section 40 is coupled to the distal end of the cable 12 and includes a test probe 46 and reference probe 48. As can be seen from FIGS. 1 and 2, the probes 46, 48 are simply leads with alligator clips which are adapted for coupling to two of the conductors under review 14.

Resistors 50 are connected as a voltage divider across the power supply 52, which is preferably a 6 volt DC battery. The ratio of the resistances of resistors 50 determines the voltage present on the inverting input 82 of voltage comparator 54. As can be seen in FIG. 2, this voltage functions as a reference—when the voltage present on the comparator 54 noninverting input 84 is more positive than the reference voltage present on the inverting input 82 the comparator 54 output 56 will rise to the positive voltage of the power supply 52. When the voltage on the comparator 54 noninverting input 84 is less positive than the voltage on the inverting input 82, the comparator 54 output voltage will fall to the negative voltage of the power supply 52. The resistor 58 supplies bias current into the noninverting input 84 of the comparator 54 and also functions as the load resistance for the voltages generated by the pulses on the conductors 14 to which the probes 46, 48 are connected. The capacitor 60 functions as a low pass filter, and attenuates spurious signals caused by crosstalk among the various conductors 14.

The detector circuit 42 is connected to the input section 40 via the output lead 56 from the comparator 54. A clock oscillator 62 sends clock pulses of constant width to the clock inputs of synchronizing element 64 and divider 66. The output lead 56 is connected to the D input of the synchronizer 64 and as the signal on the D input changes state, the Q output 68 changes to the same state as the D input on the next positive transition of the clock oscillator 62.

The Q output 68 of the synchronizer 64 is sent to the enable inputs of divider 66, display counter 70, retrigerable timer 72 and decoder 74. When the Q output 68 is high, divider 66 and display counter 70 are allowed to function and timer 72 is enabled for a retrigger. When the Q output 68 goes low, divider 66 and display counter 70 are inhibited and the timer 72 output will be triggered into its active state—meaning it will begin to time out.

The counting outputs of display counter 70 are connected to the data inputs of BCD (Binary Coded Decimal) to seven segment decoder 74. The seven segment outputs of decoder 74 are in a form suitable for driving the seven segment display 44, but are first routed through the open/short encoder 76 as shown in FIG. 2. The encoder 76 is normally transparent to the signals from the decoder 74 to the display 44. However, if either an open circuit or short circuit condition is detected, the encoder 76 disregards the signals from the decoder 74 and substitutes signals causing the display 44 to visually indicate "SH" if a short circuit condition exists or "OP" if an open circuit condition exists. For this purpose, the timer 72 is connected to the "SH" input 78 of the encoder 76, while the display counter 70 is connected to the "OP" input of the encoder 76.

Operation

The apparatus 10 of the present invention can be useful in a variety of applications. In a particularly useful application, the apparatus can be used to identify individual conductors in a multi-conductor cable in a building. For example, if the building is being installed with a local area network computer installation, the interconnecting cables are strung between the floors and various offices. At each computer installation, the individual conductors must be identified prior to connection to the multiple pin adaptor. In this case, the user connects the transmitter unit 16 to one end of the cable, for example the location of the file server, and toggles the switch 22 activating the power supply. At this point, the transmitting unit 16 is transmitting unique pulses through each conductor to Which the unit 16 is connected.

With the transmitting unit 16 coupled and operating, the user then proceeds to the location where the individual conductors must be identified, i.e. the site of one of the computer installations. The receiving unit 10 is turned on and the probes 46, 48 connected to any two of the conductors. The receiving unit 18 uses the reference probe 48 as a common ground between the unit 16 and 18 while identifyinq the particular conductor to which the test probe 46 is connected. That is, the receiving unit 18 determines the pulse width at test probe 46 and visually identifies on display 44 the number of the conductor. If a short or open condition is present, the receiving unit 18 will alternatively indicate such a condition.

1Transmitter

In more detail, the transmitter 16 operates to sequentially generate unique pulses on each of the conductors 14 as shown in FIG. 2. The clock divider 25 sends clock pulses to the input of the down counter 26. The number previously stored in the down counter 26 will be decremented by one for each clock pulse received from the clock divider 25. When the number stored in the down counter 26 decrements to zero, the terminal count output of down counter 26 will become active and send a signal through count output lead 27 as the D input to the delay element 28. The delay element 28 functions so that the Q output signal on lead 29 changes to the same state as the D input signal from lead 27 after the next clock pulse is received from the clock divider 25. The Q output signal on lead 29 proceeds to the clock input of the up counter 30 and to the asynchronous load input of the down counter 26.

When the Q signal on lead 29 enters the clock input of up counter 30, it causes the number previously stored to be incremented by one. This newly incremented number will then proceed to the binary select inputs of the demultiplexer 32 over leads 34 as shown in FIG. 2. The demultiplexer 32 functions to cause all the signals but one on sixteen output connections 36 to be at a "low" logic level. Herein, logic "high" or logic "one" is used to indicate a voltage approximating the voltage of the battery (i.e. +6 volt), while logic "low" or logic "zero" refers to a voltage approximating the negative power supply voltage. The location of the one signal at a high logic level is determined by the binary select inputs at 34. The selection of the one logic level from the four binary select inputs is made in accordance with the following table.

| BINARY SELECT | | | |
|---|---|---|---|
| D | C | B | A |
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 0 | 1 | 1 | 1 |
| 1 | 0 | 0 | 0 |
| 1 | 0 | 0 | 1 |
| 1 | 0 | 1 | 0 |
| 1 | 0 | 1 | 1 |
| 1 | 1 | 0 | 0 |
| 1 | 1 | 0 | 1 |
| 1 | 1 | 1 | 0 |
| 1 | 1 | 1 | 1 |

The following describes the output $Y_n$ for the sixteen output lines 36 as a function of the binary select inputs.

| OUTPUT LINES | | | | | | | | | | | | | | | |
|---|---|---|---|---|---|---|---|---|---|---|---|---|---|---|---|
| $Y_{15}$ | $Y_{14}$ | $Y_{13}$ | $Y_{12}$ | $Y_{11}$ | $Y_{10}$ | $Y_9$ | $Y_8$ | $Y_7$ | $Y_6$ | $Y_5$ | $Y_4$ | $Y_3$ | $Y_2$ | $Y_1$ | $Y_0$ |
| 0 | 0 | 0 | 0 | 0 | 0 | 0 | 0 | 0 | 0 | 0 | 0 | 0 | 0 | 0 | 1 |
| 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 1 | 0 | 0 | 0 | 0 | 0 |
| 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 |

It will be seen that as the up counter 30 is incremented, the binary select inputs through lines 34 to the demultiplexer 32 change, causing a new output line 36 to become active (logic "high").

Additionally, the Q signal from delay element 28 on line 29 is fed to the asynchronous load input of the down counter 26, causing the number on the counting (or Q) outputs of the up counter 30 to be loaded into the down counter 26. Loading the counting outputs from the up counter 30 into the down counter 26 causes the down counter 26 terminal count output to become inactive, and after the next clock pulse from clock oscillator 24 the Q signal (line 29) from delay element 28 will also become inactive. Once the delay element 28 becomes inactive, the clock pulses from the clock divider 25 decrement the number loaded into the down counter 26. Because the new number loaded into the down counter 26 is generated by incrementing up counter 30, the number is one larger than the previous number stored in the down counter 26. Consequently, to decrement the down counter 26 to zero and begin a new cycle requires one more clock divider pulse than in the previous cycle, causing currently active output line 36 of the multiplexer 32 to remain active for one divider 25 period longer than the output line selected during the previous cycle.

As each cycle comes to an end, a new one is started automatically, and each activated output line 36 from demultiplexer 32 will remain active for one divider 25 period longer than the previous output line 36 selected. As each output line 36 goes from inactive to active and back to inactive, the voltage goes from low to high then to low again forming a precisely timed pulse during the time the line is low. These pulses are propagated down the conductors 14 connected to the output lines 36 as shown in FIG. 2.

Figure 3:
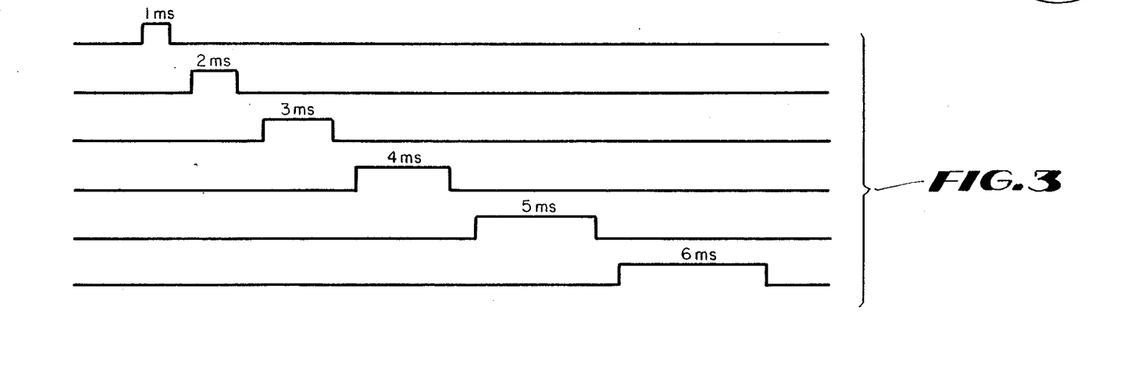
FIG. 3 is a timing diagram showing the differentiating pulse widths of the transmitted pulses.

FIG. 3 depicts the waveform of the pulses on the first six output lines 36 and corresponding conductors 14. While only six waveforms are illustrated, it will be understood that the remaining ten pulse waveforms differ with each pulse being successively one divider 25 pulse width longer. Indeed, the present invention is not constrained to 16 output lines 36 or corresponding conductors 14—any number of outputs can be generated by adding more up and down counters and demultiplexers as needed. Further, while the preferred embodiment defines the pulse (FIG. 3) with the voltage on line 36 proceeding from low to high and back to low, it is equally possible to define the pulse with a voltage progressing from high to low and back to high. Such a "low" pulse can be easily accommodated by reversing the functional labels of test lead 46 and reference lead 48 in FIG. 2.

Turning to FIG. 3, in the preferred embodiment the clock oscillator 24 operates at 32,768 Hz which is easily divided by 32 to give a pulse period (width or unit) of approximately 1 millisecond. The top waveform in FIG. 3 is the unique pulse representative of conductor number one having a corresponding pulse width 1 millisecond wide. The second waveform (from the top) in FIG. 3 represents the unique pulse propagated down a second conductor and has a pulse width 2 milliseconds wide. Each successive pulse has a corresponding pulse width 1 millisecond longer than the previous pulse. In the preferred embodiment, it has been found preferable to impose a time delay of about 1 millisecond between the trailing edge of a pulse and the leading edge of the successive pulse. Advantageously, the transmitting unit 16 can complete the cycle of all conductors to successively generate the unique pulse on all of the conductors in a very short period of time. For the sixteen conductor cable illustrated in the drawing, the pulse generation cycle is about .15 seconds. For a fifty conductor cable, the entire pulse generation cycle takes about 1.3 seconds and is continuously repeated.

2. Receiver

The operation of the receiving unit 18 is more difficult in that the receiving unit 18 is designed to also indicate when a short or open circuit condition exists. The receiving unit 18 determines one of the following conditions: (1) normal operation in which the identification of the conductor 14 coupled to the test probe 46 is displayed; (2) whether the conductor 14 coupled to the test probe 46 is an open circuit; (3) whether a short circuit exists between the conductors connected to the test probe 46 and reference probe 48; and (4) whether a short circuit exists between the conductor connected to the test probe 46 and another conductor 14 and the cable 12 (other than the conductor connected to the reference probe 48).

(i) Normal Operation

In normal operation, the probes 46 and 48 are connected to any two conductors 14, and a short or open condition does not exist in any of the two randomly selected conductors 14. As can be appreciated from FIG. 3, there are time periods when no pulses are propagated down the conductors 14 to which the test probe 46 and reference probe 48 are connected. During these time periods, the ratios of the resistances 50 will cause the voltage on the noninverting input 84 of comparator 54 to be more negative than the voltage on the inverting input 82. When the voltage on the noninverting input 84 is more negative than the inverting input 82, the output of the comparator 54 is low (line 56).

If an output pulse is propagated down the conductor 14 to which the reference probe 48 is connected, it will simply force the noninverting input s4 of the comparator 54 even more negative relative to the inverting input 82. Therefore, the pulse on the reference probe 48 will have no affect on the output of the comparator 54 and conditions will remain unchanged.

When a pulse is propagated down the conductor 14 coupled to the test probe 46 it will cause the voltage on the noninverting input 84 to be more positive than the voltage on the inverting input 82 and the output of the comparator 54 will be forced high for the period of time that the pulse persists. The high output from the comparator 54 (line 56) is passed to the D input of the synchronizer 64, which causes the synchronizer Q output 68 to go high after the next rising edge from the clock oscillator 62. As shown in FIG. 2, if the Q output on line 68 is high, it enables the clock divider 66 and the display counter 70. The clock divider 66 when enabled will accept pulses from the clock oscillator 62 as inputs and simply counts them. After counting a preset number of clock pulses, the clock divider 66 outputs a pulse to the display counter 70 input, causing the display counter 70 to increment the number stored on its counting outputs by one. In the preferred embodiment, the clock divider 66 counts the number of clock oscillator 62 pulses equivalent to the 1 millisecond pulse period illustrated in FIG. 3 prior to outputting the pulse to the display counter 70. Thus, the number stored in the display counter 70 is an indication of the pulse width in 1 millisecond units propagated down the conductor connected to the test probe 46.

The divider 66 and display counter 70 continue to count the pulse width in 1 millisecond units until the pulse at the test probe 46 is terminated. At termination the clock divider 66 is cleared and disabled, display counter 70 cleared and disabled, timer 72 retriggered, and the number stored in the counting outputs of the display counter 70 (prior to it being cleared) latched into the decoder 74. Because the clock divider 66 is programmed to count in the same time units as generated by transmitting unit 16, the number stored on the counting outputs of the display counter 70 is the number of 1 millisecond units used to generate the transmitter output pulse on the conductor 14 connected to the test probe 46. As can be appreciated, the transmitter is propagating unique pulses down each conductor differentiated by pulse width. That is, conductor number one transmits a pulse one time period wide (1 millisecond), conductor number two transmits a pulse two time periods wide (2 milliseconds), and so on, to identify each conductor 14. In the receiver, then the number generated in the display counter 70 and latched into the decoder 74 identifies the conductor 14 connected to the test probe 46.

The decoder 74 receives the number from the display counter 70 and formats the number for presentation to a seven segment display 44. The formatted number is passed through the encoder 76, which is transparent during normal operation. That is, unless the short input 78 or open input 80 is active, the encoder 76 simply passes on the formatted number for visual display in decimal digits on the display 44. Seven segment displays 44 (and corresponding counters, decoders and encoders) can be added as necessary to display multidigit numbers.

(ii) Open Circuit Condition

If the test probe 46 is connected to a conductor 14 which is an open circuit, the display 44 will visually indicate "OP." As can be seen from FIG. 2, in the open circuit condition only the bias current for the noninverting input 84 of the comparator 54 from the battery 52 will flow through the resistor 58, causing the noninverting input 84 to be more positive than the inverting input 82 of the comparator 54. With the noninverting input 84 more positive than the inverting input 82 the output of comparator 54 is high, similar to the case when the input section 40 is in normal operation. The high output on lead 56 is the D input of the synchronizer 64 forcing the Q output on lead 68 high after the next output rising edge from the clock oscillator 62. The high on the Q output lead 68 also enables the clock divider 66 and the display counter 70. As in the normal condition, the display counter 70 counts the pulses supplied by the clock divider 66, but in the open condition the display counter 70 continues to count and eventually will overflow. When the display counter 70 overflows, its terminal count output becomes active and sends a signal to the "OP" encoding input of the encoder 76 on lead 80. With the "OP" input active, any data present on the encoder 76 input leads 75 will be overridden and the encoder 76 will output data to cause the visual display 44 to indicate "OP."

(iii) Short Circuit Condition

The receiving unit 18 can function in two ways, depending upon which of two types of short circuits is detected. In the first case, the continuously low resistance (i.e. short) exists between the two conductors 14 to which the test probe 46 and reference probe 48 are connected. In the second case, a short circuit exists between two or more of the conductors 14, with one of the shorted conductors being connected to the test probe 46 while the conductor connected to the reference probe 48 is in the normal isolated condition.

In the first type of short circuit where a short exists between the test probe 46 and reference probe 48, the voltage existing on the noninverting input 84 of the comparator 54 will be more negative than the voltage on the inverting input 82. With the voltage on the noninverting input 84 more negative than the voltage on the inverting input 82, the output of the comparator 54 goes low. After the next clock oscillator 62 pulse rising edge, the Q output 68 of the synchronizer 64 will also go low initiating the timing cycle of the timer 72. If the short circuit persists for longer than the timing cycle, the timer 72 will revert to its passive low state at the end of the timing cycle placing a low on the "SH" input 78 to the encoder 76. The low output from the timer 72 will cause the encoder 76 to ignore the inputs from the decoder 74 and will, instead, send data to the display 44 to cause a display "SH." In the illustrated embodiment, the timing period is set to be slightly longer than the time required for the transmitting unit 16 to go through one complete cycle. Thus, for a 50 conductor cable 12 where the cycle takes about 1.3 seconds, the timer will be set with a timing cycle greater than 1.3 seconds.

In the second type of short circuit condition a low resistance exists between two or more conductors 14 in the cable 12 with the test probe 46 connected to one of the shorted conductors, while the reference probe 48 is connected to another conductor 14 not involved in the short circuit. Under these conditions, the receiving unit 18 functions normally, but instead of a single pulse waveform being propagated down only one conductor 14 at a time, the two or more pulse waveforms propagated on the shorted conductors will appear across all of the shorted conductors and will be sequentially displayed on the display 44.

The input section 40 will function in this type of short circuit condition (when no pulses are present on either test probe 46 or reference probe 48) with current flow from power supply 52 through resistor 58 and reference probe 48 into the conductor 14 to which the reference probe 48 is connected. The current flow proceeds to the transmitting unit 16 through the respective output connector 36 and resistor into the demultiplexer 32. At the same time (still no pulses at either probe 46, 48) test probe 46 is connected to the demultiplexer 32 in a similar manner through one or more shorted conductors 14 and respective adapters and resistors 36. Since no pulse exists on either the test probe 46 or reference probe 48 and the inactive output lines of the demultiplexer 32 are low, the outputs 36 of the inactive lines are also low. Because the output impedance of the demultiplexer 32 output lines 36 is very low and the ends of the conductors 14 connected to the probes 46, 48 are at the same voltage, the probes 46, 48 (and conductors 14 and output lines 36) will seem to be connected to each other.

Under these conditions, the power supplies of the transmitting and receiving units 16, 18 will seem connected at only one point and Will "float" relative to each other. The voltage drop across the sum of the resistances in this loop starting with the reference probe 48 and ending at the test probe 46 will appear on the noninverting input 84 of the comparator 54 and will always be less positive than the voltage on the inverting input 82. As before, with the voltage on the noninverting input 84 less positive than the voltage on the inverting input 82, the output of the comparator 54 goes low over lead 56 to the D input of the synchronizer 64. This low will cause the Q output 68 of the synchronizer 64 to go low after the next rising edge from the clock oscillator 62. Because the output of the synchronizing element 64 is connected to the input of the timer 72, when the timer 72 input goes low a timing cycle begins and the output of the timer 72 will go high for one timing period. The timer 72 is retriggerable so that if its input goes high then low again, the old timing cycle will end and a new timing period will begin. The timer 72 output will not change states during the retrigger time and will remain active as long as retriggering is accomplished before the end of each timing period. Unless retriggered, the low output from the synchronizer 64 to the timer 72 will cause the timer 72 output to revert to its passive low state at the end of timing cycle. Because of the short condition, the timer 72 is not retriggered and a low is sent over the "SH" input to the encoder 76. As before, the encoder 76 when triggered by the low output from the timer 72 will ignore the BCD to seven segment displays from the decoder 74 and will instead cause the display 44 to indicate "SH."

Because the timing period is slightly longer than the time required for the transmitting unit 16 to go through a complete cycle the timer 72 output will remain active as long as pulses are entering the input section 40 through the test probe 46 and reference probe 48. As long as the output from the timer 72 remains active, the encoder 76 remains transparent to the BCD to seven segment decoder 74 data outputs and the data is presented through the encoder 76 for visual display from the display 44.

From the above description, it should be readily appreciated that as the test probe 46 and reference probe 48 are connected to different conductors 14 of the cable 12, the display 44 will indicate either the number of the conductor to WhiCh the test probe 46 is connected, "OP," or "SH." As seen from FIG. 3 in normal operation during the time a pulse is presented to test probe 46, the remaining conductors 14 are inactive (low). The pulse on the reference probe 48 does not affect a change on the output of the comparator 54, therefore the probe 48 can be connected to any conductor 14. This characteristic of the apparatus 10 negates the need for any previously identified ground or return conductor or separate ground, since any conductor 14 to which the reference probe 48 is attached becomes the reference or return conductor between the transmitting unit 16 and receiving unit 18.

I claim:

1. An apparatus for identifying conductors form an elongated group of (n) conductors, comprising:
    transmitter means coupleable to one end of the group for sending a signal up each of said (n) coupled conductors and including
        a power supply,
        an adapted having a plurality of connectors for respective coupling to said (n) conductors, and
        pulse generator means interposed between said power supply and adapter for sequentially generating a pulse having a unique pulse width on each coupled conductor, said unique pulse width comprising one time period wide for a first conductor, two time periods wide for a second conductor, three times periods wide for a third conductor, and n time period wide for the nth conductor; and
    receiver means coupleable to the other end of the group of conductors for receiving and identifying one or more of said conductors including
        a test probe and a reference probe coupleable to any two of said conductors,
        detector circuit means coupled to said probes for identifying the pulse received by the test probe by determining the pulse width of said pulse, and for using said reference probe and corresponding conductor as a reference conductor during the transmission of said pulse received by said test probe, and
        means coupled to said detector circuit for indicating the unique identification of said pulse width received by said test probe.

2. The apparatus according to claim 1, said detector circuit means being operable for identifying a short circuit condition on one or more of the conductors connected to said probes.

3. The apparatus according to claim 1, said detector circuit means being operable for identifying on open circuit condition on one or more of the conductors connected to said probes.

4. The apparatus according to claim 1, said receiver means including a power supply.

5. The apparatus according to claim 1, said detector circuit including a input section coupled to the probes and to a power supply.

6. The apparatus according to claim 5, the input section including a comparator having one input coupled to the test probe and another input for a reference voltage.

7. The apparatus according to claim 1, said pulse generator being operable for transmitting a pulse on a first conductor having a pulse width equal to one clock period and for transmitting a pulse on a second conductor having a pulse width equal to two clock periods, where the pulses are sequentially timed with a delay therebetween.

8. In an apparatus for identifying each conductor in a group of conductors where a transmitting unit is coupleable to one end of the group of conductors and a receiving unit is coupleable at the other end of the group of conductors, the improvement wherein:
    the transmitting unit is coupleable to each conductor in the group and includes a pulse generator which generates a pulse having a unique pulse width on each conductor, said unique pulse width comprising one time period wide for a first conductor, two time periods wide for a second conductor, and n time period wide for the nth conductor; and,
    the receiving unit is coupleable to a first conductor and includes a detector circuit for identifying the unique pulse width of the pulse at said first conductor and for identifying said first conductor corresponding to said unique pulse width.

9. The apparatus according to claim 8, wherein the pulse generator generates pulses sequentially on respective conductors with a delay between successive pulses.

10. The apparatus according to claim 8, the receiving unit being coupleable to a second conductor which acts as a reference between the transmitting and receiving units.

11. The apparatus according to claim 8, the detector circuit being operable for identifying an open circuit condition in the first conductor.

12. The apparatus according to claim 8, the detector circuit being operable for identifying a short circuit condition including the first conductor.

13. In an apparatus for identifying each conductor in a group of conductors where a transmitting unit is coupleable to one end of the group of conductors and a receiving unit is coupleable at the other end of the group of conductors, the improvement wherein:
    the transmitting unit is coupleable to each conductor in the group and includes a pulse generator which generates a unique pulse on each conductor, said unique pulse width comprising one time period wide for a first conductor, two time periods wide for a second conductor, and n time period wide for the nth conductor; and
    the receiving unit is coupled to first and second conductors and includes a detector circuit operable for identifying the unique pulse on the first conductor while using the second conductor as a reference between the transmitting and receiving units.

14. The apparatus according to claim 13, the pulse generator being operable for generating said pulses sequentially with a time delay between pulses, the second conductor operating as a reference during the pulse on said first conductor.

15. The apparatus according to claim 13, the detector circuit being operable for determining if a short circuit condition exists between the first and second conductors.

16. A method of identifying a conductor from a group of conductors comprising the steps of:
  transmitting a unique pulse on each conductor at one end of the group, including transmitting a pulse one time period wide on a first conductor, transmitting a pulse two time periods wide on a second conductor, and transmitting a pulse n time periods wide on the nth conductor,
    the transmitted pulses being differentiated by their respective pulse widths to differentiate said conductors;
  receiving the pulses at the other end of the group;
  determining the pulse width of the transmitted pulse on at least one conductor at said other end; and
  identifying said one conductor based on the received pulse width.

17. The method of claim 16, wherein the determining step including using another conductor as a reference between said ends and analyzing the pulse width on the one conductor.

18. The method according to claim 16, wherein the transmitting step includes sequentially transmitting said pulses.

19. The method according to claim 16, said identifying step including the substep of visually displaying a representation assigned to said received pulse width.

20. The method according to claim 16, including the step of determining if a short circuit condition exists on another conductor.

21. The method according to claim 16, including the step of determining if an open circuit condition exists on another conductor.

* * * * *

UNITED STATES PATENT AND TRADEMARK OFFICE
CERTIFICATE OF CORRECTION

PATENT NO. : 4,937,519
DATED : June 26, 1990
INVENTOR(S) : John B. Fields, III

It is certified that error appears in the above—identified patent and that said Letters Patent is hereby corrected as shown below:

In claim 1, line 28, column 11, after the word --including-- insert "--".

In claim 1, line 30, column 11, delete --adapted-- and insert "adapter".

In claim 1, line 43, column 11, after the word --including-- insert "--".

Signed and Sealed this

Third Day of September, 1991

Attest:

HARRY F. MANBECK, JR.

Attesting Officer

Commissioner of Patents and Trademarks